United States Patent [19]

Devin et al.

[11] Patent Number: 5,561,621

[45] Date of Patent: Oct. 1, 1996

[54] NON-VOLATILE PROGRAMMABLE BISTABLE MULTIVIBRATOR WITH REDUCED PARASITICS IN READING MODE NOTABLY FOR MEMORY REDUNDANCY CIRCUIT

[75] Inventors: Jean Devin, Aix en Provence; Jean-Michel Mirabel, Cabries, both of France

[73] Assignee: SGS-Thomson Microelectronics, S.A., Gentilly, France

[21] Appl. No.: 381,529

[22] Filed: Jan. 31, 1995

[30] Foreign Application Priority Data

Jan. 31, 1994 [FR] France ................................. 94 01036

[51] Int. Cl.$^6$ ................................................. G11C 11/40
[52] U.S. Cl. ...................... 365/49; 365/154; 365/185.09; 365/200
[58] Field of Search ............................. 365/49, 185, 200, 365/154

[56] References Cited

U.S. PATENT DOCUMENTS

| | | | |
|---|---|---|---|
| 4,460,978 | 7/1984 | Jiang et al. | 365/154 |
| 5,068,825 | 11/1991 | Mahant-Shetti et al. | 365/154 |
| 5,347,484 | 9/1994 | Kwong et al. | 365/49 |

FOREIGN PATENT DOCUMENTS 0525680  2/1993  European Pat. Off. .

OTHER PUBLICATIONS

IEEE Journal of Solid–State Circuits., vol. 17, No. 5, Oct. 1982, pp. 847–851 Donaldson et al. "SNOS 1Kx8 static nonvolatile RAM".
IEEE Journal of Solid–State Circuits., vol. 22, No. 5, Oct. 1987, pp. 64–692 Ciaoca et al. "A million–cycle CMOS 256K EEPROM".

*Primary Examiner*—David C. Nelms
*Assistant Examiner*—Son Dinh
*Attorney, Agent, or Firm*—Robert Groover; Betty Formby

[57] ABSTRACT

The disclosure relates to integrated circuits and, notably, to memories. A description is given of a bistable type of programmable, non-volatile memory, namely a memory that can take one state or another by the programming of one of two floating-gate transistors of the cell. To program a cell such as this, there are two transistors for the application of a programming voltage (VPRG). In order that the signals going through the programming paths (in particular the address signals) may not disturb the state of the cell in reading mode, provision is made for two isolation transistors interposed between the transistors for the application of the programming voltage and the drains of the floating-gate transistors. These isolation transistors are made conductive by a signal CAMSEL solely for a programming operation and solely for only one group of cells to be programmed. These cells can be applied notably to the storage of defective address elements in the redundancy circuits of large-capacity memories.

44 Claims, 3 Drawing Sheets

NON-VOLATILE PROGRAMMABLE BISTABLE MULTIVIBRATOR WITH REDUCED PARASITICS IN READING MODE NOTABLY FOR MEMORY REDUNDANCY CIRCUIT

CROSS-REFERENCE TO RELATED APPLICATION

This application claims priority from French App'n 94-01036, filed Jan. 31, 1994, which is hereby incorporated by reference. However, the content of the present application is not necessarily identical to that of the priority application.

BACKGROUND AND SUMMARY OF THE INVENTION

The invention relates to integrated circuits. An object of the invention is a non-volatile electrically programmable bistable multivibrator. It is designed essentially, though not exclusively, for use in a redundancy circuit of a memory in integrated circuit form.

To provide for a clear understanding of the invention in the context in which it has been conceived of, a brief reminder shall first of all be given of the principles of redundancy circuits currently used in large-capacity memories.

The redundancy circuits of a memory are implemented when defects appear in the rows (word lines used to address the memory) or the columns (bit lines conveying the data elements to be read or written in the memory).

For example, if a column is defective, it is replaced by a redundancy column as follows: the address of the defective column is memorized in a defective address memory; this defective address memory is a memory of the type that is addressable by its contents (hereinafter called CAM or contents addressable memory); whenever an address is applied to the main memory, this address is also applied to the CAM. If the address applied is identical to the address memorized, a redundancy circuit is put into operation and acts to disconnect the defective column and connect a redundant column in its place in a way that is invisible to the user.

In practice, according to the organization of the main memory, if a column is defective, it is rather a group of columns containing this defective column that will be replaced by a group of redundancy columns: in general, if a group of columns is defined by an address bit of the large-capacity memory, it is this group of columns that will be replaced as a whole. Hereinafter, for simplicity's sake, reference shall be made, in the description, to the replacing of only one column rather than to the replacing of a group of columns.

For a main memory of several megabits, the possibility of repairing several defects is foreseen. There are therefore as many redundancy columns as there are defective columns or rows which it should be possible to repair. With each redundancy column, there is associated a respective CAM containing the address of a defective column. If N defects are to be repaired, N redundancy columns and N CAMs are needed. Typically, N=36 for a four-megabit or sixteen-megabit memory.

If a column of the main memory is designated by an M-bit address (for example M=5), then each CAM contains at least M+1 bits: M bits to define the address of a defective column and one validation bit to indicate that the redundancy circuit corresponding to this CAM should actually be activated when the defective address is applied to the CAM.

To make CAMs, the first devices used were groups of physical fuses, fused electrically or fused by laser beam, each fuse representing an address bit or a validation bit. These fuses had drawbacks (relating to reliability, bulkiness, consumption, and difficulty of programming) and were soon replaced by non-erasable non-volatile memory cells. The latter too had drawbacks (they consumed substantial current) and there was a gradual trend towards the use of programmable bistable multivibrators comprising two floating-gate transistors for each address bit or validation bit.

FIG. 1 shows one possible approach, a non-volatile programmable bistable multivibrator constituting a storage cell of a defective address bit (or a validation bit), and therefore constituting one of the M+1 cells of a defective address CAM.

The output OUT of this cell is at a logic level 0 or 1 depending on the state in which the bistable multivibrator is programmed. This output therefore defines a value of an address bit (or the value of the validation bit).

If the cell corresponds to one of the M defective address bits, the output of each cell of these M address bits is applied to an input of an exclusive-OR gate (not shown). The exclusive-OR gate receives, at another input, a corresponding address bit received by the main memory. The outputs of the exclusive-OR gates corresponding to the different address bits of one and the same defective address memory are applied to an input of a NOR gate (not shown). The output of this NOR gate gives a logic 1 level only when there is coincidence between all the address bits applied and all the corresponding bits of the defective address memory. The output of the NOR gate is validated by the output of the memory cell corresponding to the validation bit, for example by means of an AND gate (not shown). The output of the AND gate is the output of the CAM and is used to put a redundancy path into operation whenever the address applied to the main memory corresponds to the defective address recorded.

In general, there are N memories with defective addresses, for example N=36. During the testing of the main memory, the detection of a defective column activates the storage of the address of this column in one of the CAMs. The different CAMs are thus successively programmed as and when the defects are detected. During the normal operation of the main memory, the addresses of this memory are applied simultaneously to all the CAMs. If there is a correspondence between the applied address and the address stored in one of them, the redundancy path corresponding to this address is activated.

To enable the programming of a defective address in a CAM, it is therefore provided that a respective address bit of the main memory will be applied to each cell of the CAM. The programming is done upon a command of the testing apparatus in the event of the detection of a defect at the address being tested.

The individual memory cell shown in FIG. 1 has two arms with a floating-gate transistor TGF1, TGF2 in each arm. The arms are arranged so as to form a bistable multivibrator as soon as one of these two transistors is programmed. The state of the bistable multivibrator, represented by the output OUT and corresponding to an address bit or a validation bit, is then a function of that one of the two transistors which is programmed. At the outset, the two transistors are in a non-programmed or blank state. During the testing of the memory, one of the two transistors is programmed to obtain either a 0 or a 1 at the output OUT of the cell, thus defining a definitive stable state 0 or 1 of the cell.

More specifically, the cell of FIG. 1 has two identical arms in parallel between a supply terminal A (potential Vcc of the order of 3 volts) and a terminal B. The terminal B is at a zero potential VS in reading or programming mode and may also be taken to a high potential VS (12 volts) in erasure mode if an erasure mode is planned (flash EPROM). In series in each arm, there is a P channel transistor (T1, T2), an N channel transistor (T3, T4), and a floating-gate transistor (TGF1, TGF2). The gate of the P channel transistor (T1, T2) of one of the arms is connected to the drain of the P channel transistor (T2, T1) of the other arm. The gates of the N channel transistors (T3, T4) are connected together to a common potential VB whose value depends on the mode of operation (about 1.8 volts in reading mode; 0 volts in programming or erasure mode to have one volt at the drain of the cells in reading mode). The transistors T3 and T4 are isolation transistors in order to prevent the transmission, to the transistors T1 and T2, of the relatively high voltages applied to the floating-gate transistors in programming or erasure mode. The gates of the floating-gate transistors TGF1, TGF2 are connected to a common potential VGF depending on the operation (about 3 volts in read mode, about 12 volts in programming mode). The source of these transistors is connected to the node B (potential VS). The drain potentials of the floating-gate transistors are controlled by transistors T5 and T6 respectively, enabling either the connection of the drain to a programming potential VPRG (transistor T5 or T6 conductive) or the leaving of the drain in high impedance (transistor T5 or T6 off). In programming mode, the gate of the transistor T5 is controlled by a programming signal PROG and the gate of T6 by a complementary signal NPROG. As a result, a choice is made, depending on the state of the signal PROG, of that transistor of the two floating transistors which must be programmed and that transistor which must remain blank. In reading mode, the drain of the transistors T5 and T6 remains in a state of high impedance, the voltage VPRG being not applied to these drains.

The cell is called a bistable cell because it has one stable state among two possible states, the stable state that it takes depending on that one of the two transistors that has been programmed. The state of the cell is read at the drain of one of the P channel transistors (T2 for example). This drain is connected to the input of a first inverter INV1 followed by a second inverter INV2. The output of INV2 is the output OUT of the cell. The output of INV1 is used as a complementary output NOUT if it is needed.

Finally, a supplementary transistor T7 may make it possible, solely in test mode, in order to avoid the floating nodes when T3 and T4 are off, to place the input of the inverter INV1 temporarily at the ground (for an initialization of the state of the cell at each power-on-reset operation). The gate of this transistor is activated by an initializing rectangular-wave signal INIT produced by a standard power-on-reset circuit (not shown).

The present invention is aimed at improving bistable multivibrators to make them easier to use, notably in applications of the type described here above (memory redundancy).

According to the invention, a respective isolation transistor is interposed between the drain of a floating-gate transistor and the transistor (T5, T6) which is used to apply a programming voltage to this drain.

The invention therefore relates to a programmable memory cell with two floating-gate transistors, of the type constituting a bistable multivibrator whose state is defined by the programming of one of the two transistors, comprising two transistors for the selective application, to only one of the two floating-gate transistors, of a voltage enabling it to be programmed, the other transistor not receiving this voltage, wherein an isolation transistor is interposed between each transistor for the application of the programming voltage and the drain of the corresponding floating-gate transistor.

The invention can be applied to a cell of the type shown in FIG. 1, namely a cell comprising two arms, each arm having a P channel transistor series-connected with a respective floating-gate transistor of this arm, the drain of the P channel transistor of one of the arms being connected to the gate of the P channel transistor of the other arm.

The isolation transistors are made conductive in programming mode of the cell considered, but they may be turned off for other modes (notably in the mode of programming of other batteries of bistable cells, and especially in reading mode).

In particular, these isolation transistors greatly reduce the influence of the signals that go through the paths for the programming of the different cells. In the application to the redundancy of a main memory, these programming paths are the circuits which go from the address decoders of the main memory up to the floating-gate transistors. They are in operation during the use of the memory. The signals that flow therein may act indirectly and undesirably, because of the parasitic capacitances, on the functions of the bistable multivibrator and notably on its state.

The isolation transistors according to the invention may limit the influence of these parasitic effects if they are off.

The invention can be applied chiefly to integrated circuit memories comprising a main memory and redundancy circuits. The memory cells are used to store the addresses of defective elements of the main memory. The isolation transistors are preferably controlled by an active signal that makes them conductive, the active signal being given by test circuits to a group of memory cells when an address of a defective element has to be stored in this group. This signal is made inactive in the normal mode of use of the memory.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
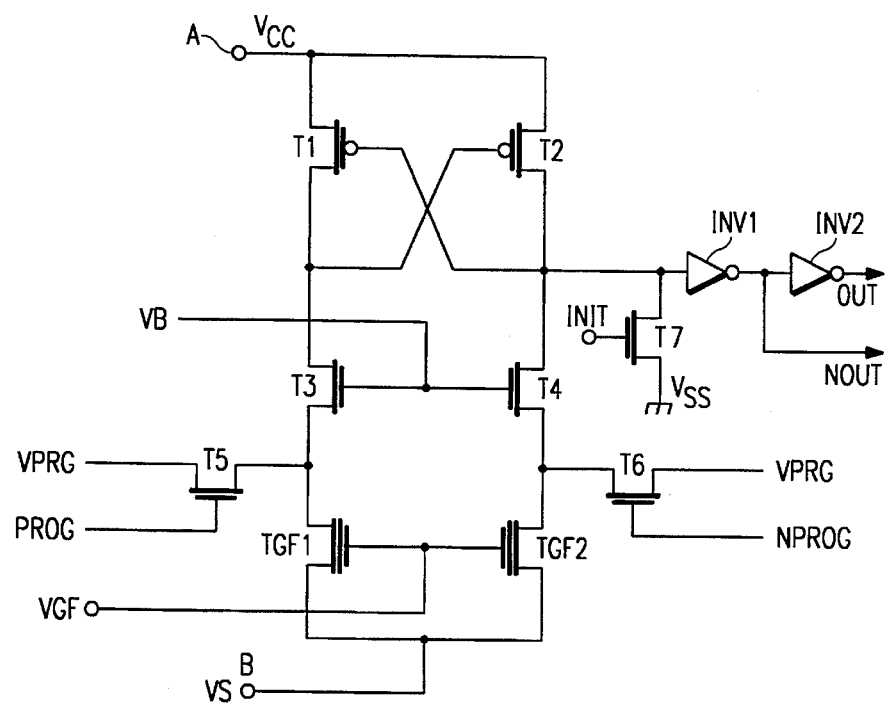
FIG. 1 shows a known storage cell (as described above)
Figure 2:
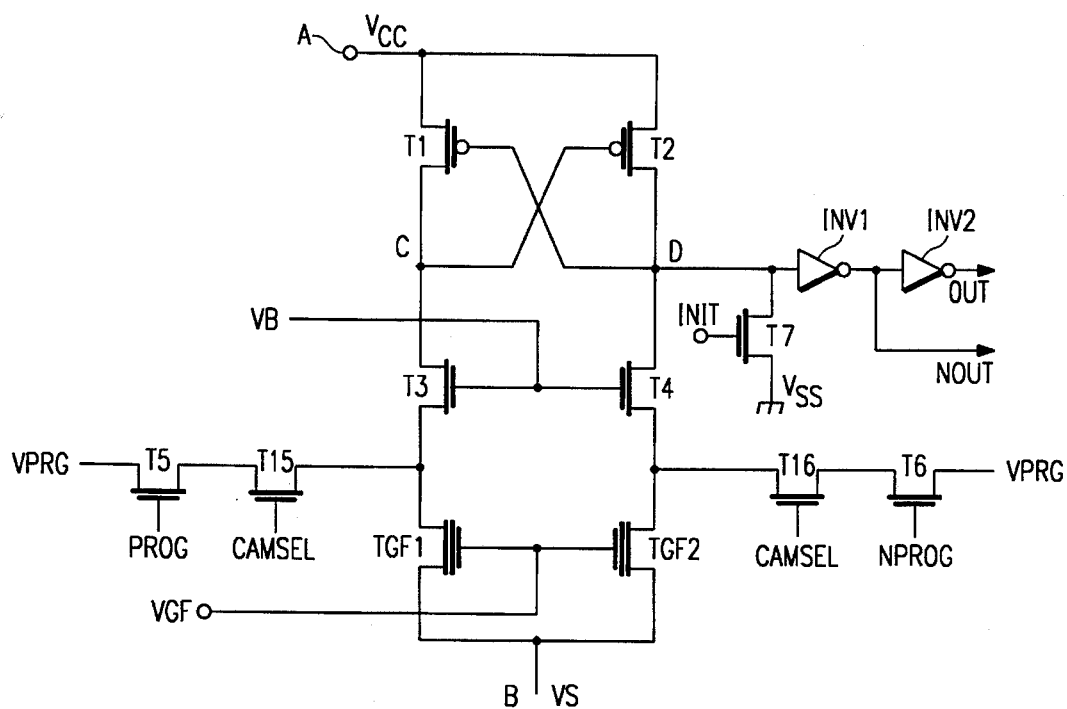
FIG. 2 shows an embodiment of a cell according to the invention.

The numerous innovative teachings of the present application will be described with particular reference to the presently preferred embodiment (by way of example, and not of limitation), in which:

A non-volatile storage cell according to the invention is shown in FIG. 2. It is essentially constituted like the cell of FIG. 1, but also includes two additional transistors T15 and T16 (referred to herein as "isolation transistors"). The description made with reference to FIG. 1 remains valid for FIG. 2 with the following modifications: a first isolation transistor T15 is interposed between the transistor T5 (transistor for the application of the programming voltage VPRG) and the drain of the floating-gate transistor TGF1. A second isolation transistor T16 is interposed between the transistor T6 (second transistor for the application of the voltage VPRG) and the drain of the other floating-gate transistor TGF2.

The transistors T15 and T16 are controlled in principle by one and the same signal CAMSEL.

The signal CAMSEL is such that the transistors T15 and T16 are off in reading mode and on in the mode of programming the cell. It can be arranged so that the signal CAMSEL in the active state (which makes the transistors conductive) is given simultaneously to all the bistable cells of a group of cells and that it is not given to the other groups of cells. In the application to the redundancy of a main memory, this means that, during the testing of the memory, a defective address may be found and may give rise to a programming of this address in a group of cells designed to store a defective address. It is this group of cells that then receives the signal CAMSEL in the active state. The other groups of cells (corresponding to already stored defective addresses or defective addresses that are as yet free for the following part of the testing of the main memory) do not receive the signal CAMSEL and the programming voltage VPRG cannot be applied to them. The signal CAMSEL, which is normally inactive, is therefore given by the testing circuits (internal and/or external) of the main memory and it is placed in the active state successively for the different groups of cells as and when defects are found and necessitate the storage of an address.

In reading mode, the signal CAMSEL remains inactive. The transistors T15 and T16 remain off. In any case, the voltage VPRG does not need to be transmitted to the drains of the floating-gate transistors in reading mode. For the application to the storage of the defective addresses of a main memory, the reading mode is the normal mode of operation since the programming of the cells takes place only during the testing of the main memory.

In reading mode, the gates of the transistors T5 and T6 permanently receive the address signals applied to the main memory. Although the drains of these transistors do not receive any voltage (drains at high impedance), there is a risk that the capacitive coupling between the gates and sources of the transistors T5 and T6 might transmit parasitic signals towards the drains of the floating-gate transistors, and these parasitic signals might bring about imbalance in the state of the cell and disturb the outputs OUT, NOUT. The isolation transistors T15, T16 eliminate this risk.

The invention can be applied also to other types of bistable cells. For example it can be applied to the types of cells described in French patent applications FR 9401034 and FR 9401035, both filed Jan. 31, 1994 and hereby incorporated by reference, wherein an additional transistor, controlled by the output OUT, is interposed between the transistor T2 and the transistor T4 or wherein the programming is done not by the application of a voltage of 5 to 7 volts to the drain, with the source grounded, but rather by the application of a voltage of 5 to 7 volts to the source, the drain being grounded for the transistor to be programmed and being left in a state of high impedance for the transistor that is not to be programmed. In the latter case, the programming voltage VPRG that must be considered herein is the ground potential.

Note that the differential connection of the two floating-gate transistors provides very good read margin.

Figure 3:
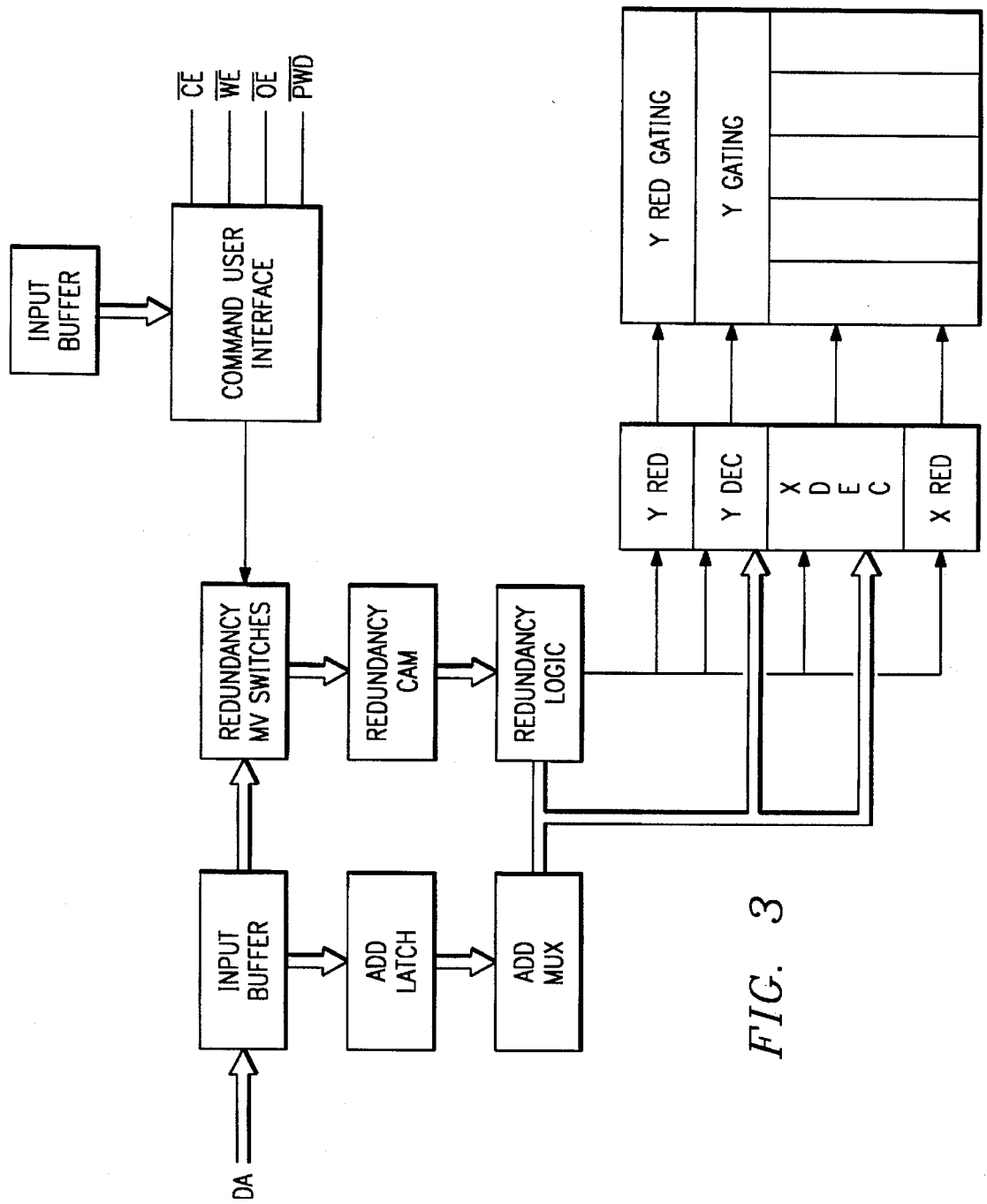
FIG. 3 shows redundancy selection logic which incorporates content-addressable memory cells as shown in FIG. 2.

FIG. 3 shows redundancy selection logic which incorporates content-addressable memory cells as shown in FIG. 2. The cell of FIG. 2 is used in the "Redundancy CAM" block.

Figure 4:
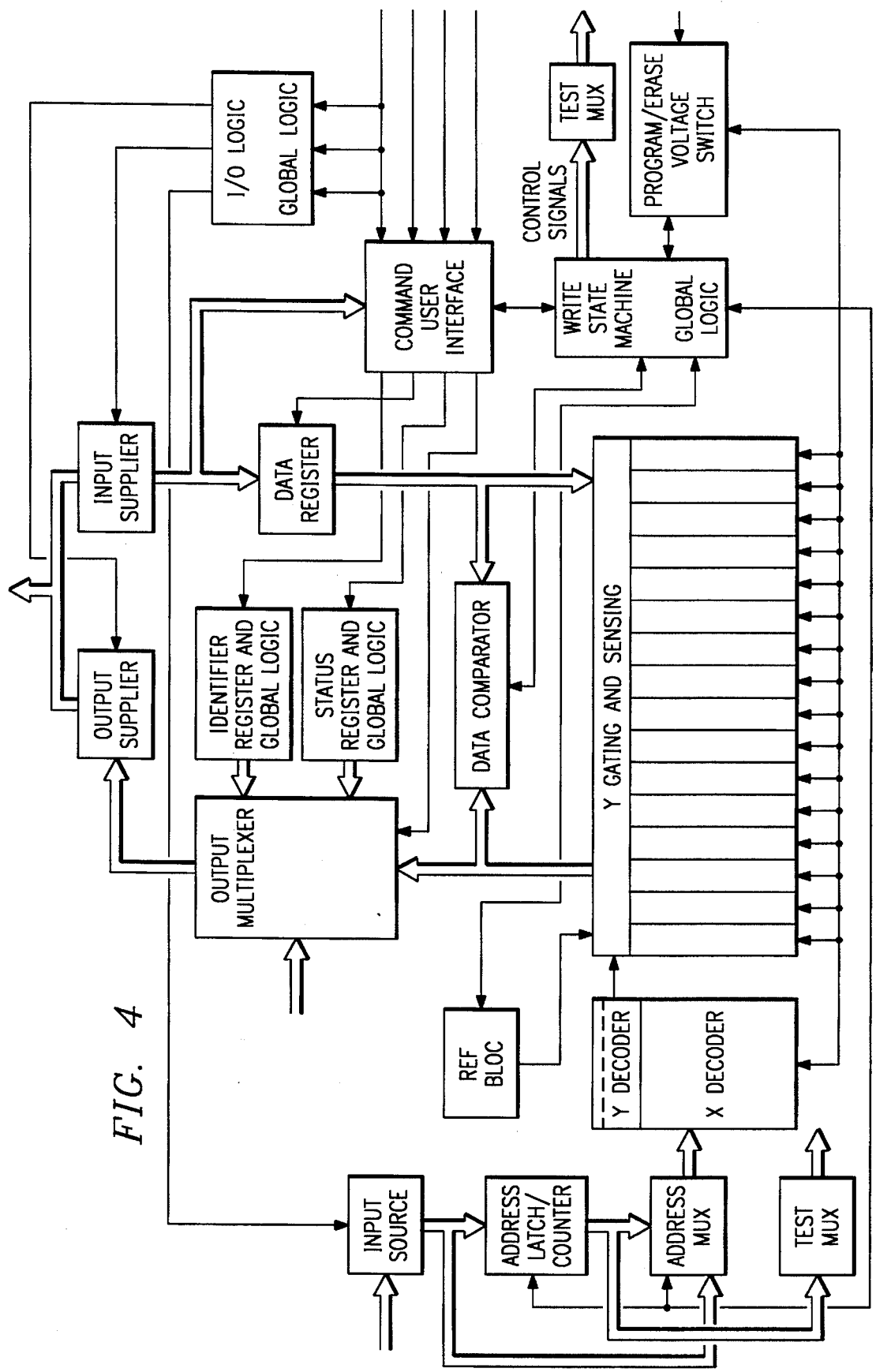
FIG. 4 shows a high-level block diagram of a nonvolatile memory in which the redundancy selection logic incorporates content-addressable memory cells as shown in FIG. 2.

FIG. 4 shows a high-level block diagram of a nonvolatile memory in which the redundancy selection logic incorporates content-addressable memory cells as shown in FIG. 2. This embodiment is particularly advantageous where the cell technology in the main memory array is also used for the nonvolatile transistors in the CAM cells.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

The invention can be used in various nonvolatile-CAM applications other than redundancy, such as electronic-locking circuits, set-top boxes, and neural networks, as long as a "CAMSEL" signal is available in the device. The innovative cell of FIG. 2 can also be used for other nonvolatile memory applications.

The invention can also be used very advantageously with rewritable non-volatile transistors, to provide a rewritable non-volatile CAM memory. In this embodiment the erasure is achieved (for example) by forcing VS to a high voltage, VGF to zero, and VB and CAMSEL to zero. Thereafter one of the cells is programmed again to save a desired data state.

What is claimed is:

1. An integrated circuit, comprising:
   a pair of nonvolatile memory transistors, each having a first source/drain terminal thereof operatively connected to a first power supply connection;
   a pair of latch transistors operatively connected, in series with said pair of memory transistors, to form two circuit branches between first and second power supply connections;
   a pair of isolation transistors each having a first source/drain terminal connected to a second source/drain terminal of a respective one of said memory transistors, said isolation transistors both being controlled by a common select signal; and
   a pair of field-effect programmation transistors each connected between a second source/drain terminal of said respective one of said isolation transistors and a common programmation voltage, said pair of programmation transistors being connected to receive complementary signals on respective gates thereof under at least some circumstances.

2. The integrated circuit of claim 1, further comprising a pair of cascoded transistors interposed between said pair of memory transistors and said pair of latch transistors.

3. The integrated circuit of claim 1, wherein said latch transistors are field-effect transistors of opposite conductivity type to said memory transistors.

4. The integrated circuit of claim 1, wherein said nonvolatile memory transistors are matched.

5. The integrated circuit of claim 1, further comprising a logic gate operatively connected to be driven by at least one of said latch transistors.

6. The integrated circuit of claim 1, wherein said first power supply connection is a ground connection.

7. The integrated circuit of claim 1, wherein said programmation voltage is a ground connection.

8. The integrated circuit of claim 1, wherein said programmation voltage is a high positive voltage Vpp.

9. The integrated circuit of claim 1, further comprising at least one reset transistor which is operatively connected to selectably initialize the state of said latch transistors.

10. A memory redundancy selection circuit, comprising:
a content-addressable memory, including a plurality of memory cells which each include
a pair of nonvolatile memory transistors, each having a first source/drain terminal thereof operatively connected to a first power supply connection;
a pair of latch transistors operatively connected, in series with said pair of memory transistors, to form two circuit branches between first and second power supply connections;
a pair of isolation transistors each having a first source/drain terminal connected to a second source/drain terminal of a respective one of said memory transistors, said isolation transistors both being controlled by a common select signal; and
a pair of field-effect programmation transistors each connected between a second source/drain terminal of said respective one of said isolation transistors and a common programmation voltage, said pair of programmation transistors being connected to receive complementary signals on respective gates thereof under at least some circumstances;
said content-addressable memory also including match-detection logic which is connected to receive a decoded address signal, and to provide a redundancy select output when coincidence is detected between said decoded address signal and data stored in a plurality of said cells; and
a programmation circuit, connected to selectably provide write data to the gates of said programmation transistors.

11. The integrated circuit of claim 10, further comprising a pair of cascoded transistors interposed between said pair of memory transistors and said pair of latch transistors.

12. The integrated circuit of claim 10, wherein said latch transistors are field-effect transistors of opposite conductivity type to said memory transistors.

13. The integrated circuit of claim 10, wherein said nonvolatile memory transistors are matched.

14. The integrated circuit of claim 10, further comprising a logic gate operatively connected to be driven by at least one of said latch transistors.

15. The integrated circuit of claim 10, wherein said first power supply connection is a ground connection.

16. The integrated circuit of claim 10, wherein said programmation voltage is a ground connection.

17. The integrated circuit of claim 10, wherein said programmation voltage is a high positive voltage Vpp.

18. The integrated circuit of claim 10, further comprising at least one reset transistor which is operatively connected to selectably initialize the state of said latch transistors.

19. An integrated circuit memory, comprising:
an array of memory cells, including a plurality of redundant groups of cells;
address decode logic, connected to receive address bits and to provide decoded addresses accordingly;
row and column selection logic, connected to receive said decoded addresses;
redundant group selection logic, which is connected to receive said decoded addresses; and
a content-addressable memory, including a plurality of memory cells which each include:
a pair of nonvolatile memory transistors, each having a first source/drain terminal thereof operatively connected to a first power supply connection;
a pair of latch transistors operatively connected, in series with said pair of memory transistors, to form two circuit branches between first and second power supply connections;
a pair of isolation transistors having a first source/drain terminal each connected to a second source/drain terminal of a respective one of said memory transistors, said isolation transistors both being controlled by a common select signal; and
a pair of field-effect programmation transistors each connected between a second source/drain terminal of said respective one of said isolation transistors and a common programmation voltage, said pair of programmation transistors being connected to receive complementary signals on respective gates thereof under at least some circumstances;
said content-addressable memory also including match-detection logic which is connected to receive a decoded address signal, and to provide a redundancy select output when coincidence is detected between said decoded address signal and data stored in a plurality of said cells; and
a programmation circuit, connected to selectably provide write data to the gates of said programmation transistors.

20. The integrated circuit of claim 19, further comprising a pair of cascoded transistors interposed between said pair of memory transistors and said pair of latch transistors.

21. The integrated circuit of claim 19, wherein said latch transistors are field-effect transistors of opposite conductivity type to said memory transistors.

22. The integrated circuit of claim 19, wherein said nonvolatile memory transistors are matched.

23. The integrated circuit of claim 19, further comprising a logic gate operatively connected to be driven by at least one of said latch transistors.

24. The integrated circuit of claim 19, wherein said first power supply connection is a ground connection.

25. The integrated circuit of claim 19, wherein said programmation voltage is a ground connection.

26. The integrated circuit of claim 19, wherein said programmation voltage is a high positive voltage Vpp.

27. The integrated circuit of claim 19, further comprising at least one reset transistor which is operatively connected to selectably initialize the state of said latch transistors.

28. A method for operating a nonvolatile content-addressable memory cell, comprising the steps of:
(a) providing an integrated circuit which comprises a pair of nonvolatile memory transistors, each having a first source/drain terminal thereof operatively connected to a first power supply connection; a pair of latch transistors operatively connected, in series with said pair of memory transistors, to form two circuit branches between first and second power supply connections; a pair of isolation transistors each having a first source/drain terminal connected to a second source/drain terminal of a respective one of said memory transistors, said isolation transistors both being controlled by a common select signal; and a pair of field-effect programmation transistors each connected between a second source/drain terminal of said respective one of said isolation transistors and a common programmation voltage, said pair of programmation transistors being connected to receive complementary signals on respective gates thereof under at least some circumstances;

(b) when writing is desired, turning on said isolation transistors, and applying complementary data signals to said programmation transistors to program said memory transistors; and (c) when reading is desired, turning off said isolation transistors;

whereby said isolation transistors prevent disturbance by signals which may be present on the gate of said programmation transistors.

29. A set of programmable memory cells of the type constituting bistable multivibrators whose state is defined by the programming of one of two floating-gate transistors within each cell, each cell comprising:

two field-effect transistors for the selective application, to a first one of said two floating-gate transistors, of a voltage enabling said first floating-gate transistor to be programmed, a second of said floating-gate transistors not receiving said voltage, wherein an isolation transistor is interposed between each of said two field-effect transistors and a source/drain region of the corresponding floating-gate transistor;

said isolation transistors of each individual cell both being connected to receive a cell-selection signal which selects said individual cell.

30. A set of memory cells according to claim 29, wherein each said cell has two arms, each arm having a P channel transistor series-connected with a respective floating-gate transistor, a source/drain region of the P channel transistor of one of the arms being connected to the gate of the P channel transistor of the other arm.

31. An integrated circuit memory comprising a main memory and redundancy circuits, wherein the redundancy circuits comprise memory cells according to claim 30 to store addresses of defective elements of the main memory.

32. An integrated circuit memory comprising a main memory and redundancy circuits, wherein the redundancy circuits comprise memory cells according to claim 29 to store addresses of defective elements of the main memory.

33. The integrated circuit memory according to claim 32, wherein the isolation transistors are controlled by an active signal to make said isolation transistors conductive, the active signal being given by test circuits to a group of memory cells when an address of a defective element has to be stored in this group.

34. The integrated circuit memory of claim 33, wherein the signal is made inactive in the normal mode of use of the memory.

35. The integrated circuit memory of claim 31, wherein the isolation transistors are controlled by an active signal to make said isolation transistors conductive, the active signal being given by test circuits to a group of memory cells when an address of a defective element has to be stored in this group.

36. The integrated circuit memory of claim 35, wherein the signal is made inactive in the normal mode of use of the memory.

37. The method of claim 28, wherein said integrated circuit provided in said step (a) further comprises a pair of cascoded transistors interposed between said pair of memory transistors and said pair of latch transistors.

38. The method of claim 28, wherein said latch transistors are field-effect transistors of opposite conductivity type to said memory transistors.

39. The method of claim 28, wherein said nonvolatile memory transistors are matched.

40. The method of claim 28, wherein said integrated circuit provided in said step (a) further comprises a logic gate operatively connected to be driven by at least one of said latch transistors.

41. The method of claim 28, wherein said first power supply connection is a ground connection.

42. The method of claim 28, wherein said programmation voltage is a ground connection.

43. The method of claim 28, wherein said programmation voltage is a high positive voltage Vpp.

44. The method of claim 28, wherein said integrated circuit provided in said step (a) further comprises at least one reset transistor which is operatively connected to selectably initialize the state of said latch transistors.

* * * * *